(12) United States Patent
Ogut et al.

(10) Patent No.: US 10,555,067 B2
(45) Date of Patent: Feb. 4, 2020

(54) EARPHONE HOUSING WITH INTEGRATED TUNING FEATURES

(71) Applicants: Christopher E. Ogut, Portland, OR (US); Vitaliy Y. Belonozhko, Vancouver, WA (US); Bogdan Belonozhko, Vancouver, WA (US)

(72) Inventors: Christopher E. Ogut, Portland, OR (US); Vitaliy Y. Belonozhko, Vancouver, WA (US); Bogdan Belonozhko, Vancouver, WA (US)

(73) Assignee: 1964 Ears LLC, Vancouver, WA (US)

( * ) Notice: Subject to any disclaimer, the term of this patent is extended or adjusted under 35 U.S.C. 154(b) by 0 days.

(21) Appl. No.: 15/857,331

(22) Filed: Dec. 28, 2017

(65) Prior Publication Data

US 2019/0208307 A1 Jul. 4, 2019

(51) Int. Cl.

| H04R 25/00 | (2006.01) |
| H04R 1/10 | (2006.01) |
| G06F 17/50 | (2006.01) |
| H04R 31/00 | (2006.01) |

(52) U.S. Cl.
CPC .......... *H04R 1/1058* (2013.01); *G06F 17/50* (2013.01); *H04R 1/105* (2013.01); *H04R 1/1016* (2013.01); *H04R 31/006* (2013.01)

(58) Field of Classification Search
CPC ...... H04R 11/02; H04R 17/00; H04R 23/008; H04R 25/02
See application file for complete search history.

(56) References Cited

U.S. PATENT DOCUMENTS

| 6,097,826 A * | 8/2000 | Clavadetscher ..... | H04R 25/656 381/322 |
| 2006/0083398 A1* | 4/2006 | Wilson ................. | H04R 1/1016 381/380 |
| 2007/0071265 A1* | 3/2007 | Leedom ............... | H04R 25/608 381/322 |
| 2015/0230035 A1* | 8/2015 | Prchal .................. | H04R 25/608 381/323 |
| 2015/0296316 A1* | 10/2015 | Nielsen ................ | H04R 25/654 381/325 |
| 2018/0234600 A1* | 8/2018 | Zeien .................. | A61B 5/0082 |

\* cited by examiner

*Primary Examiner* — Amir H Etesam
(74) *Attorney, Agent, or Firm* — Mersenne Law

(57) ABSTRACT

Custom in-ear monitors (headsets, headphones, earbuds, hearing aids) having improved audio fidelity characteristics and improved manufacturability are constructed by designing a virtual three-dimensional model housing including sound and vent tubes, and equipment mounting receptacles and clips; and fabricating the housing substantially simultaneously or all-in-one-go using, e.g., a 3D printer. The sound and vent tubes comprise features such as inflection points and profile variations that are impossible to construct using traditional subtractive manufacturing processes.

10 Claims, 10 Drawing Sheets

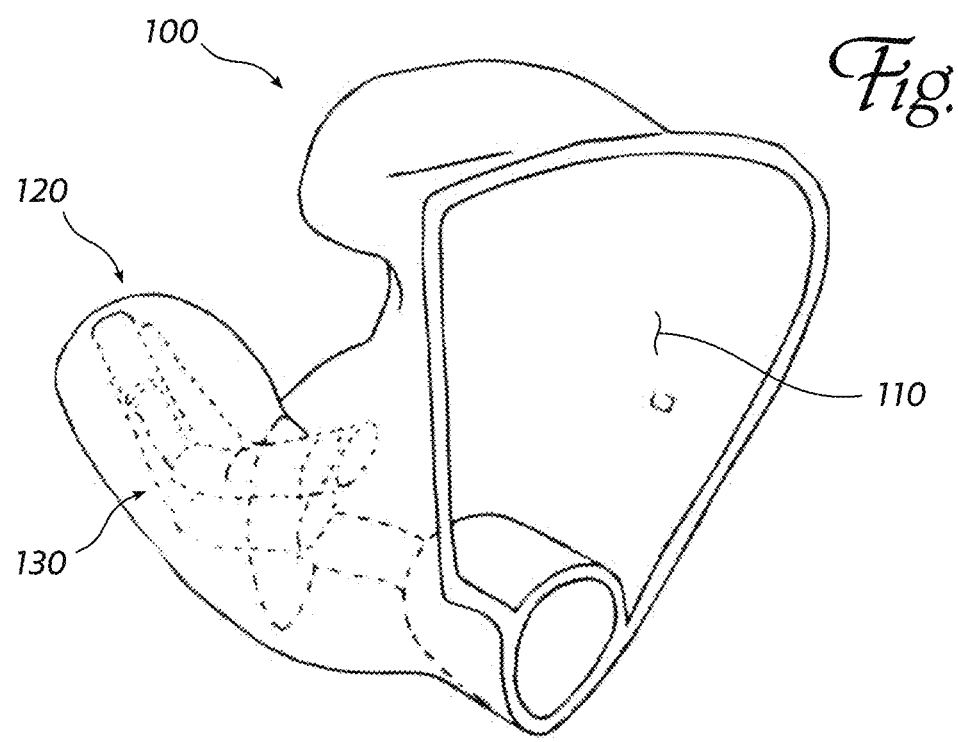
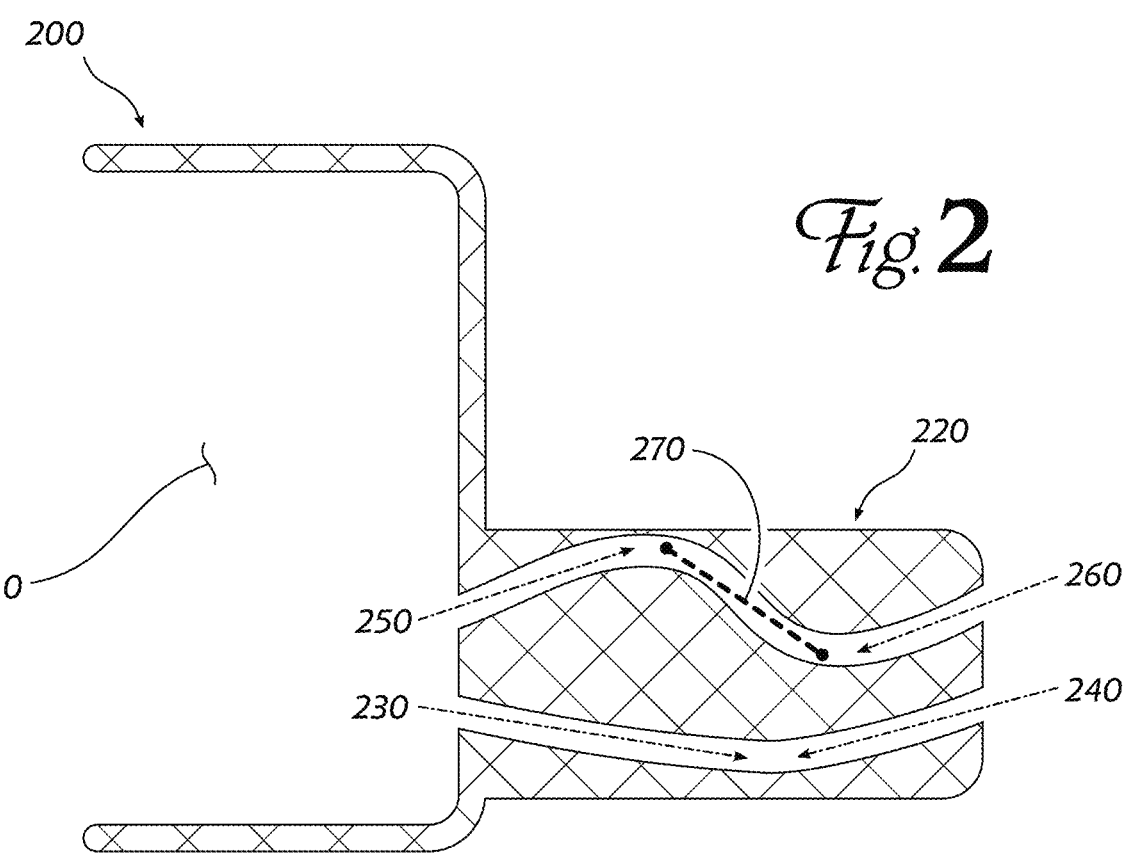

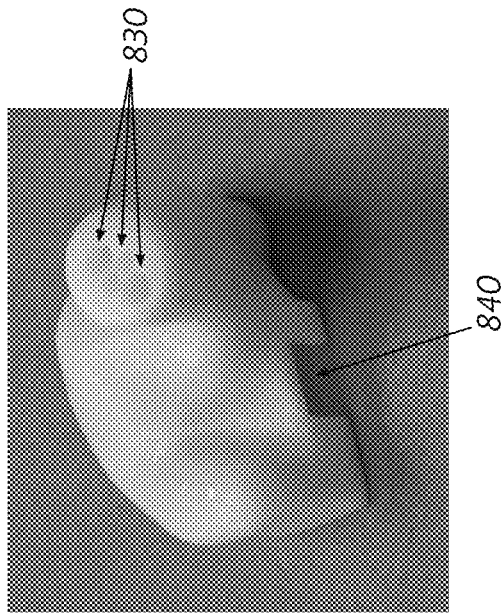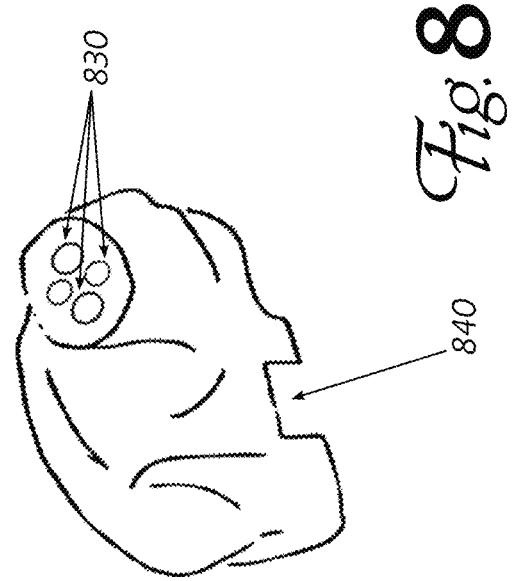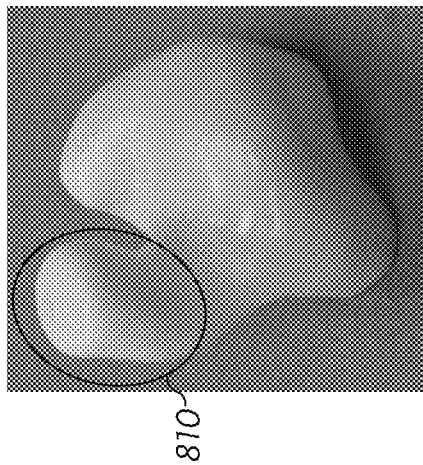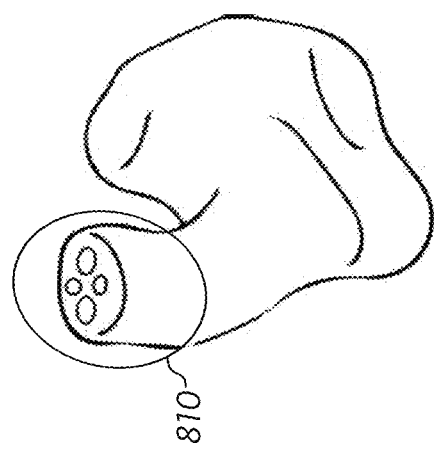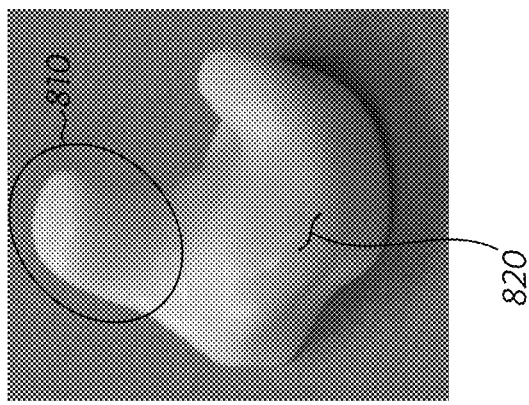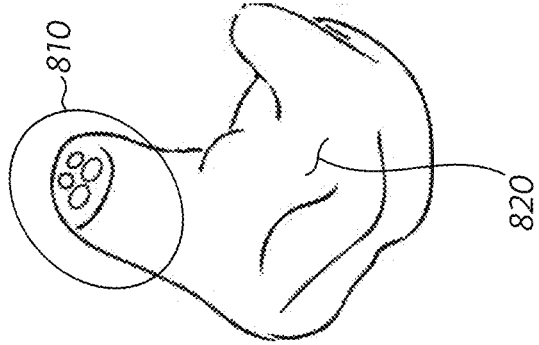
Fig. 8

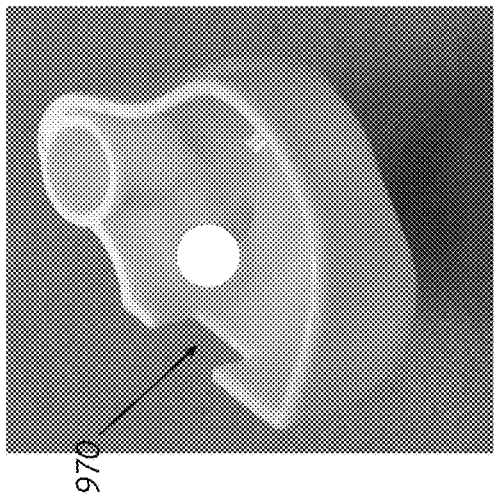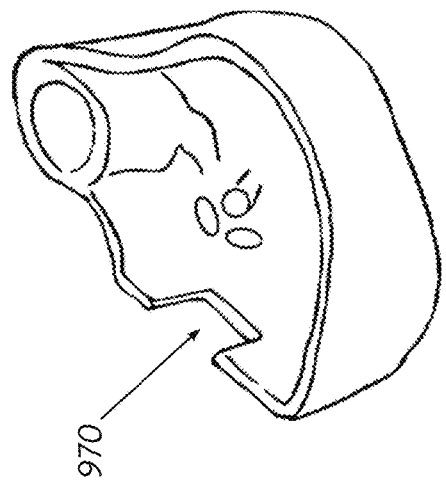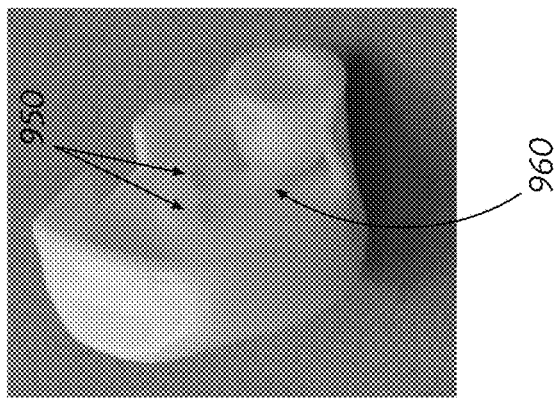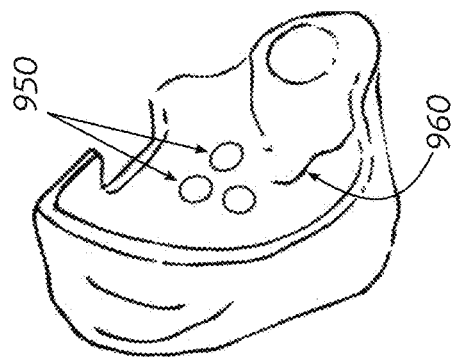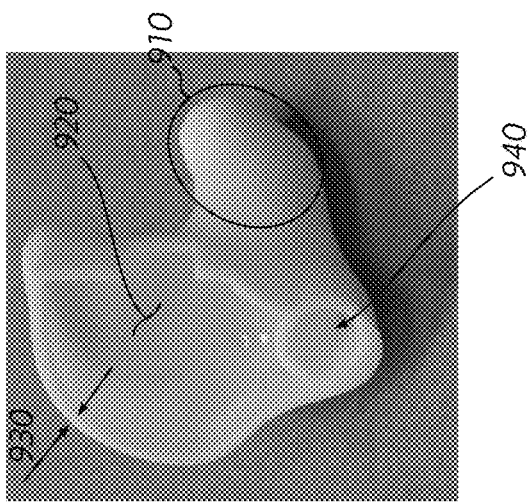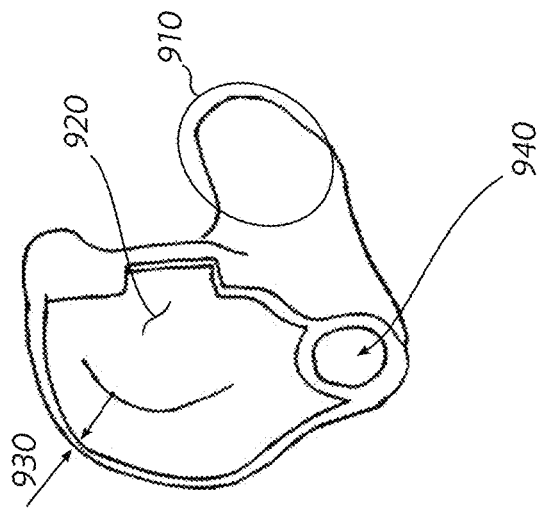
Fig. 9

EARPHONE HOUSING WITH INTEGRATED TUNING FEATURES

CONTINUITY AND CLAIM OF PRIORITY

This is an original U.S. utility patent application.

FIELD

The invention relates to electro-acoustic personal audio systems in the nature of headphones and earphones. More specifically, the invention relates to passive features of earphone housings that improve sound fidelity and manufacturing efficiency.

BACKGROUND

Traditional personal listening devices utilize one or more drivers as audio reproduction sources. The sound waves from these drivers are commonly carried from an enclosed, sub-miniature electro-acoustic transducer or driver, through a tube or sound bore connected thereto, and terminating at the tip of the canal portion of the device. In such earphones, the device's overall frequency response is affected by the length and inner diameter of the tubing or bores used to direct the output of the drivers to the earpiece or tip of the device. This use of tubing or bores is used to tailor the audio response of the drivers, but also introduces tube resonance, affecting the frequency response of the driver connected to the tubing or bore. Tubing or bores can also constrict the sound waves passed from the driver through the tube or bore, often complicating the acoustic design of the device or exerting a deleterious effect on the overall fidelity of the system.

Alternate arrangements of transducers and other components in earphones can simplify the design or construction of the device, or improve its sound-reproduction fidelity. These benefits may be of significant value in this field.

SUMMARY

Embodiments of the invention are multi-driver in-ear monitors or earphones, where at least one driver delivers its sound waves through a tube or bore formed together with a structural housing through which the tube passes.

BRIEF DESCRIPTION OF DRAWINGS

FIG. 1 shows an earphone housing according to an embodiment of the invention.

FIG. 2 shows a simplified view of a housing with sound bores.

FIG. 8 shows several views of the exterior of a housing constructed according to an embodiment.

FIG. 9 shows several views of the interior of the housing constructed according to an embodiment.

DETAILED DESCRIPTION

Figure 3:
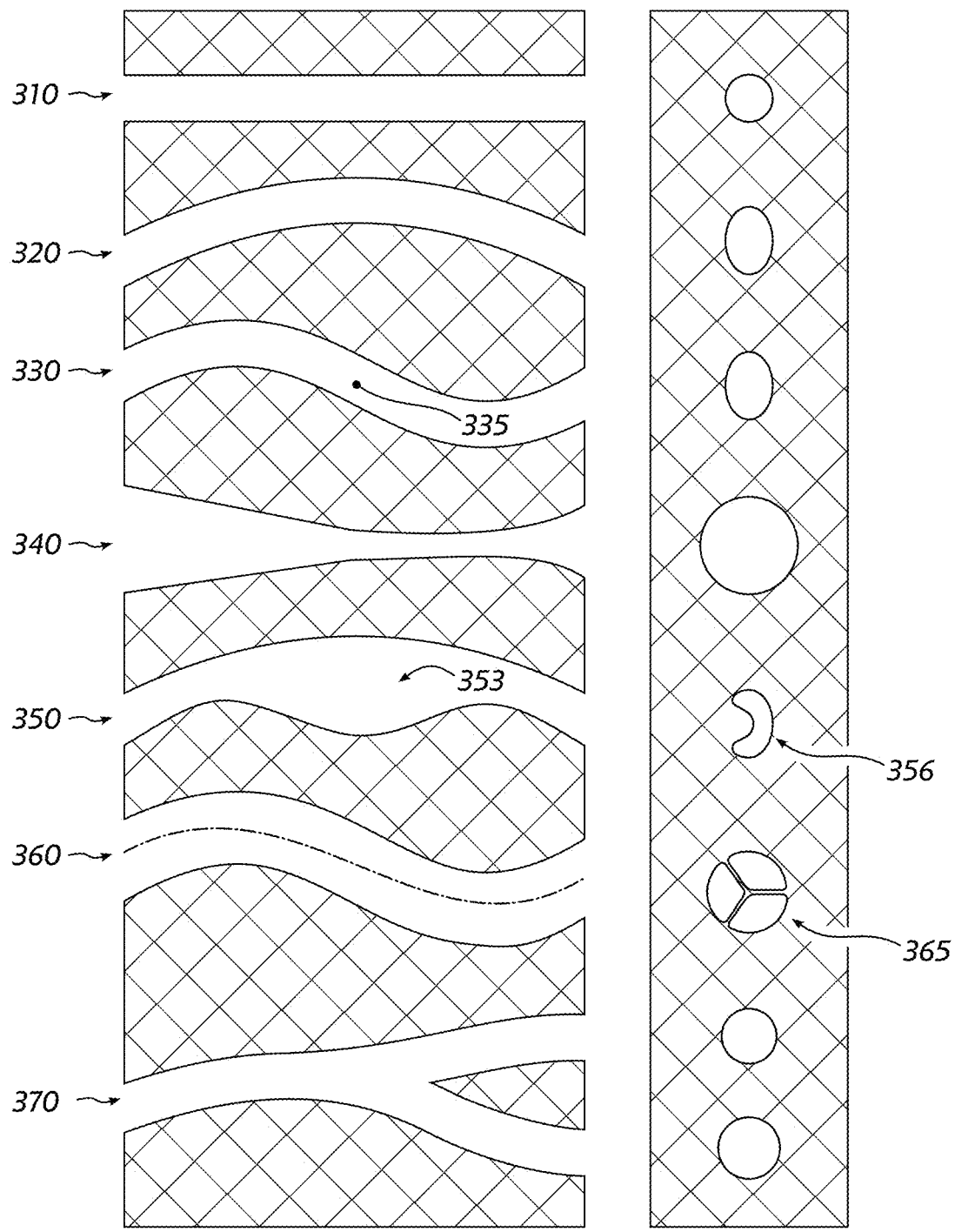
FIG. 3 shows side and end views of a variety of sound bores according to an embodiment of the invention.

Embodiments of the invention are in-ear monitors (also called canalphones and earbuds) with complex-shaped audio channels or passageways and other features to improve assembly accuracy and manufacturing efficiency.

FIG. 1 shows a sample earphone housing 100 according to an embodiment of the invention. The overall shape is designed to rest in a user's outer ear, with a protrusion 120 that extends into the ear canal. The housing is partially hollow, leaving a space 110 that can contain audio drivers, microphones, electronic circuitry, and other components of a complete earphone. As described in greater detail below, embodiments are characterized by comprising a plurality of tubes or sound bores, shown in dashed lines at 130. These tubes carry sound waves from audio transducers in the hollow space 110 through the protrusion 120 that mates with the ear canal and into the airspace adjacent the user's eardrum. These areas of a user's anatomy are oddly-shaped, so actual embodiments are challenging to depict in simple line drawings. Simplified representations of embodiments are used when appropriate to highlight the characteristics that distinguish an inventive earphone housing from that which has gone before.

FIG. 2 shows a simplified view of an earphone housing 200 according to an embodiment of the invention. A housing typically has a hollow or open space 210 which rests in or near the user's outer ear (auricle); this space can hold batteries, electronic circuitry, electroacoustic transducers (drivers, speakers) and other components of an in-ear monitor or hearing aid. The open space often has a cover, though this is not shown in this Figure. Adjacent to this outer portion is a protrusion 220 which is shaped to fit snugly into the user's ear canal, substantially sealing the ear canal to prevent sound from entering from outside. The protrusion often has a complex shape, corresponding to the complex shape of the ear canal, but in this simplified depiction, it is shown as a rectangle.

Two channels, or bores, are shown passing through the protrusion from the hollow space 210 to an enclosed airspace inside the user's ear canal, adjacent his tympanic membrane (eardrum). These channels allow sound waves created by a transducer located in the hollow, outer portion of the monitor to pass through the protrusion and be heard by the user.

In the prior art, channels were formed by drilling or grinding through an often-solid, molded protrusion. This technique restricts the number and configuration of the channels to ones that can be reached from one end or the other by a straight rotary tool (230, 240). A distinguishing characteristic of an embodiment of the invention is a passageway through the protrusion having a portion that is not accessible by a straight rotary tool from either end of the passageway, as shown at 250, 260 and 270: the portion of the passage at 270 cannot be reached by a straight tool from either end of the passage. Another way of expressing this characteristic is that the centerline of passage 250, 260, 270 has an inflection point near the middle of segment 270 where the centerline curvature changes from positive to negative (that is, the bend changes directions). In the prior art, such a passage could be possible to make and if it was attempted to be made in two parts, this approach quickly reaches its limits for multiple passages, or passages that curve or bend in another orthogonal direction, are desired.

The channels, tubes or sound bores of an embodiment may take a variety of shapes, some examples of which are shown in FIG. 3. A straight, uniform-diameter circular bore 310 is the simplest of these. Bores may be simply curved with a round profile, 320, or may have complex curves 330 with inflection points 335 where curvature changes from positive to negative.

A tube may decrease in diameter linearly, like a truncated cone, or increase with a curve like a trumpet, 340. The tube may have enlarged portions along its length, 353, and/or may have a non-circular profile 356.

To fit more bores in a small-diameter ear canal, a plurality of tubes may be placed along a common axis 360; such tubes may be separated from one another along their run by very thin and roughly even partitions. Such pluralities of tubes are called "bore groups." Tubes in a bore group may be of approximately equal sizes, as shown at 365, or may be of different sizes. Tubes may subdivide or split along their length, 370.

Note that FIG. 3 shows tubes bending and changing sizes in only two dimensions. It should be understood that an embodiment is a three-dimensional structure, and so tubes may bend and change sizes in any direction.

In an embodiment, combinations of these bore features can be used to adjust the length and volume of each bore, which allows its acoustic and pneumatic characteristics to be controlled precisely. For bores that are not intended to carry sound (e.g., vent tubes), the flexibility in placing and sizing the channels allows them to avoid other elements whose size or placement is important to the acoustic performance of the device.

Figure 4:
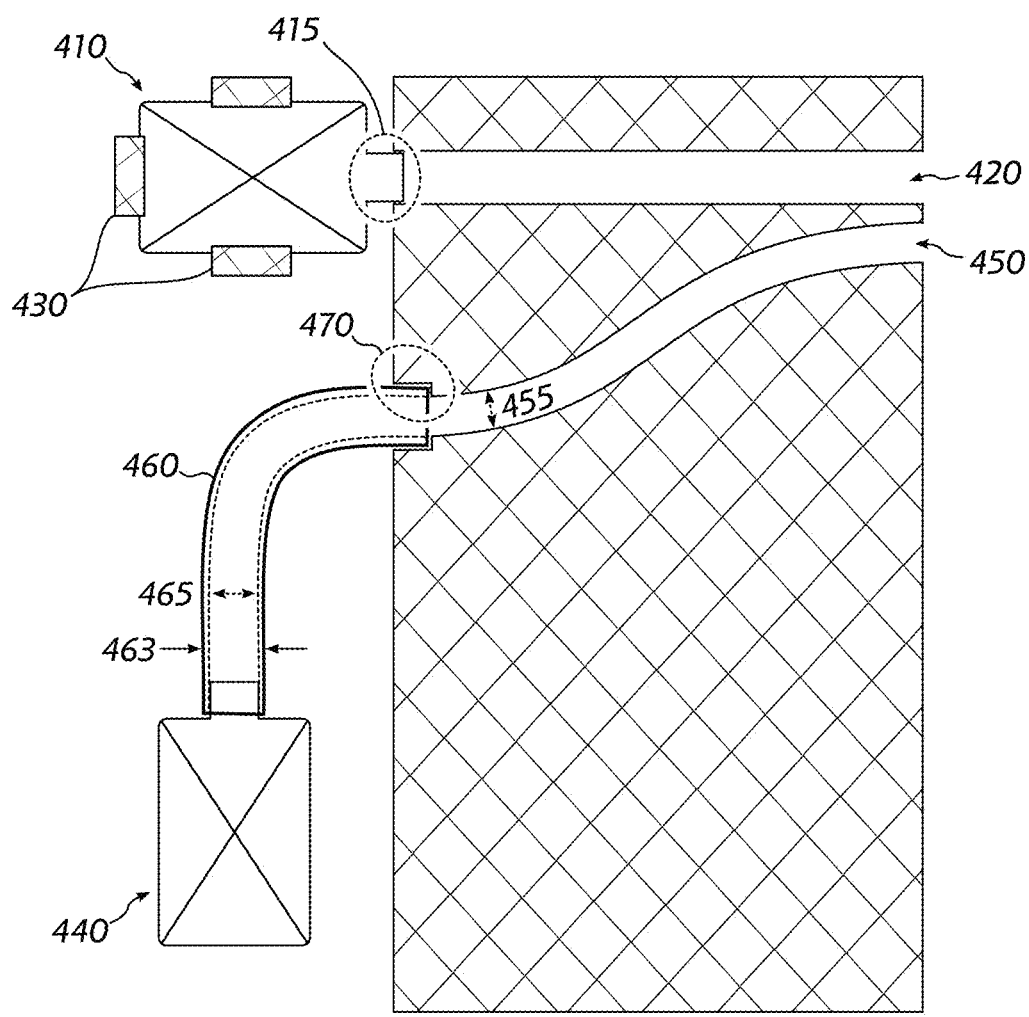
FIG. 4 shows an arrangement of drivers and housing bores according to another embodiment.

FIG. 4 shows some features of an earphone housing that can improve modularity and assembly ease. An electroacoustic transducer (driver, speaker) 410 may be received as a sealed module having a cylindrical spout 415 through which sound is emitted. An earphone housing according to an embodiment may have a sound bore 420 sized to couple directly to the spout (i.e., a "socket" for the spout). The housing may also comprise clips, dividers or guide partitions 430 to hold driver 410 in place against the sound bore 420. Assembly of such an embodiment may be significantly accelerated over a prior-art earphone where drivers must be manually aligned and cemented in place. In a multi-driver earphone, another driver 440 may be connected to its sound bore 450 by a flexible tube 460. The outer diameter of the tube 463 may match the diameter at one end of bore 450, as shown at 470. The sound bore diameter may have a sharp discontinuity near the surface, so that the inner diameter 455 of the bore beyond the discontinuity matches the inner diameter of the tube 465.

Earphone housings according to embodiments of the invention may be fabricated using equipment and techniques commonly known as "3D Printing." In 3D printing, a virtual model of the desired structure is prepared using solid modeling and computer-aided design techniques and software. Then, the model is transmitted to a fabrication device, which creates an object that substantially matches the surfaces, volumes and voids of the virtual model. The process can be thought of as reducing the model to a three-dimensional array of small cubic volumes ("voxels"), which may either be empty or contain the material of the housing. The 3D printer may replicate the model by fusing together particles or melted drops of a thermoplastic material such as nylon, ABS or PLA, or by solidifying selected portions of a photosensitive resin. Since 3D printers build up structures layer by layer, complex sound bores and other features may be constructed, even though such features would be difficult or impossible to create by standard plastic molding techniques or by removing material from a solid workpiece (subtractive machining such as CNC). An earphone housing according to an embodiment will include sound bores and other channels whose interior surfaces substantially match those of a virtual model stored on a non-volatile computer-readable medium of a computer.

Figure 5:
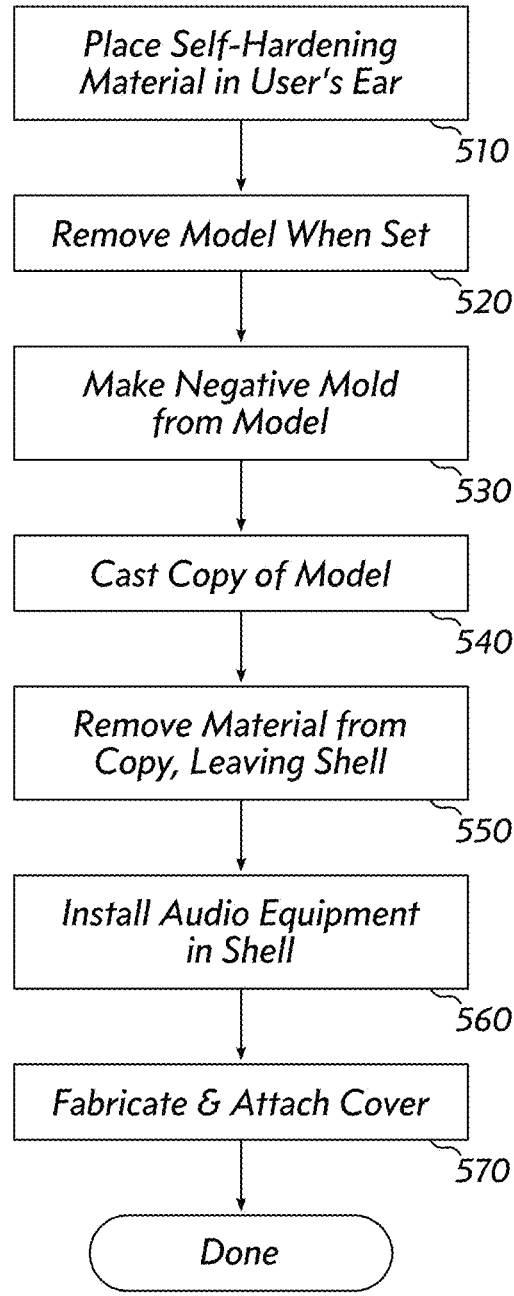
FIG. 5 is a flow chart outlining a prior-art manufacturing method.

In the prior art (FIG. 5), custom-fit earphones were constructed by introducing a viscous, self-hardening material into the user's outer ear canal and auricle (510). Once the material sets, it can be extracted from the ear (520), and serves as a model of the outer surface of the custom-fit earphone. A negative mold is made from the model (530), and then a copy of the model is cast in the mold from a suitable biocompatible material, such as a thermoset plastic or polymerized resin (540).

Material is removed from the copy by drilling and grinding, leaving just a shell whose outer surface complements the user's outer ear canal and auricle (550). Suitable audio reproduction equipment (audio drivers, electronic frequency crossovers, batteries, etc.) is installed in the shell (560). Finally, a cover may be placed over the audio reproduction equipment to protect it (570), and the custom-fit earphone is complete.

Figure 6:
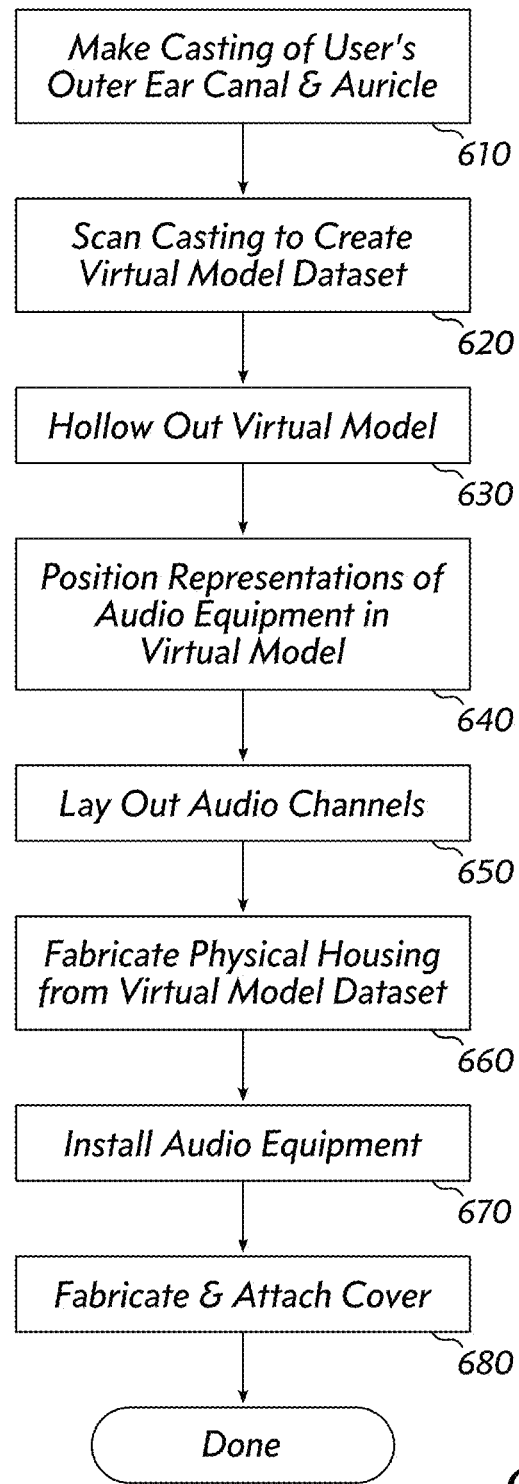
FIG. 6 is a flow chart outlining a manufacturing method according to an embodiment of the invention.

Step 550, removing material from the cast copy, is often done by time-consuming, manual grinding and drilling. This process also limits the number of bores that can be safely drilled without compromising the structural integrity of the shell. Errors during this operation may damage or destroy the cast copy, requiring a new copy to be cast. Custom-fit earphones manufactured according to an embodiment of the invention may improve yield and reduce time, as explained with reference to FIG. 6.

As in the prior art, a self-hardening material is used to construct a model of the user's outer ear canal and auricle (610). Next, the model is scanned to produce a virtual model—a data set describing the size, shape and contours of the model surface (620). Standard 3D modeling techniques are used to "hollow out" this virtual model (630), leaving walls of suitable thickness. The portion of the virtual model that extends into the user's ear canal (also referred to in this disclosure as the "protrusion") may be left mostly solid.

Still working with virtual-model dataset, representations of the audio reproduction equipment (e.g., audio drivers or speakers, including without limitations balanced-armature drivers) are positioned at suitable locations within the virtual model shell (640). Audio channels are laid out in the virtual model (650) so that when the virtual model is fabricated and audio equipment is installed, the sound waves can travel from the drivers, through sound bores traversing the protrusion to reach the user's eardrum. The audio channels may include characteristics like those described with reference to FIG. 3, so that the length, diameter, volume and other parameters match the desired audio performance of the drivers to be installed. In particular, a plurality of channels (a "bore group") may be placed adjacent each other along a common lengthwise axis, so that each channel is spaced apart from its neighbors. Channels in a bore group may be of equal size, or of unequal size.

Since this part of the process is still working with a virtual model, errors such as audio channels piercing the model surface at incorrect locations can easily be corrected. Furthermore, audio channel features that would be difficult or impossible to form by subtractive manufacturing techniques (e.g., grinding, milling or drilling a solid model) can be specified in the virtual model dataset.

Next, the virtual model is transmitted to a 3D printer which fabricates the housing of the earphone (660). During this fabrication step, the complete housing (shell, protrusion, tubes, sound bores, equipment mounting clips and other features) are formed substantially simultaneously or all in one go—3D printers typically build up an object as a series of layers over a few minutes, and there is often little or no post-fabrication modification required to arrive at a finished piece. For purposes of this disclosure, "substantially simultaneous fabrication" refers to the fabrication of an earphone housing by a printer or similar device in a single, brief manufacturing operation.

Drivers and other audio equipment are installed (670) and a cover may be added (680) to produce a finished earphone. In some embodiments, the housing fabricated by the 3D printer may, in use, contact the skin of the user's ear directly, while in other embodiments, a durable coating may be applied over the outer surface of the housing.

Figure 7:
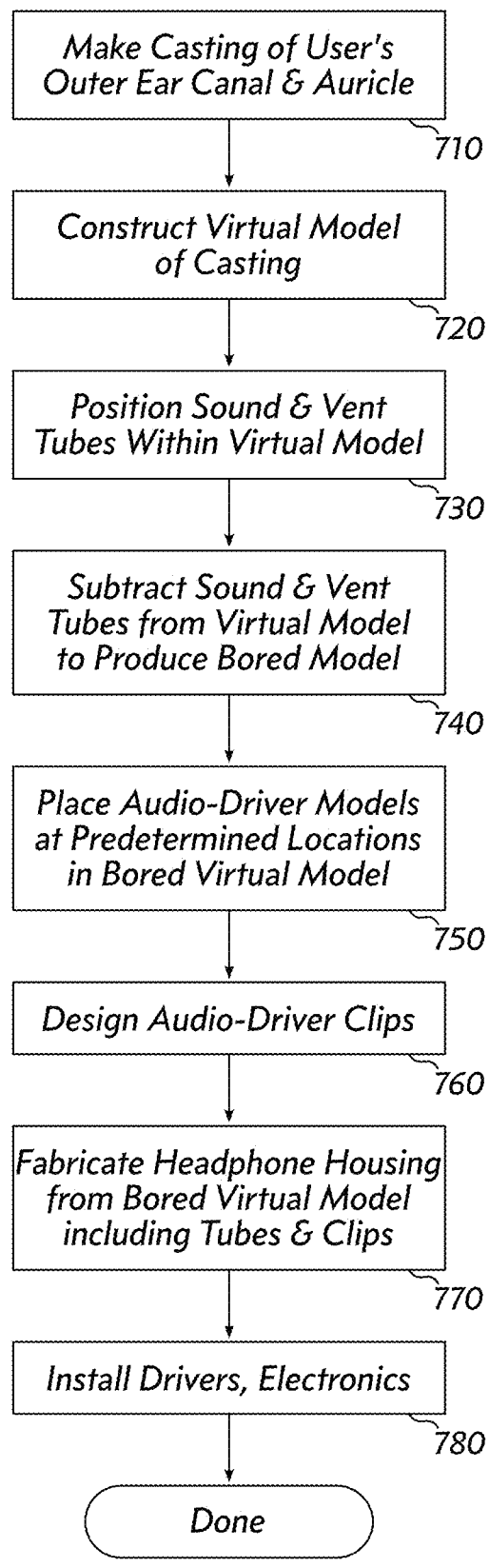
FIG. 7 is a flow chart highlighting certain distinguishing details of a manufacturing method of an embodiment.

FIG. 7 is another outline of a process by which an embodiment can be manufactured. This flow chart focuses on several distinguishing characteristics of the process. As before, it begins with the making of a casting of the user's outer ear canal and auricle (710). This casting is scanned to produce a virtual model (720). The model may be simplified and cleaned up, and the portion that lies outside the ear canal is hollowed out (operations not shown).

Next, a plurality of sound and vent tubes are positioned within the virtual model (730). Tubes intended to carry sound waves may be carefully sized and positioned so that they have the desired audio transmission characteristics. For example, they may be laid out with bends or size or profile changes not required to fit within the outer boundaries of the model, but made so that the length or enclosed volume of the tube is suitable for the range of frequencies the tube is intended to carry from a driver to the user's ear canal. Vent tubes, which are not intended to carry sound waves, may be laid out with less concern for length or volume, since the air within them is essentially static compared to the sound waves in the sound tubes.

Figure 10:
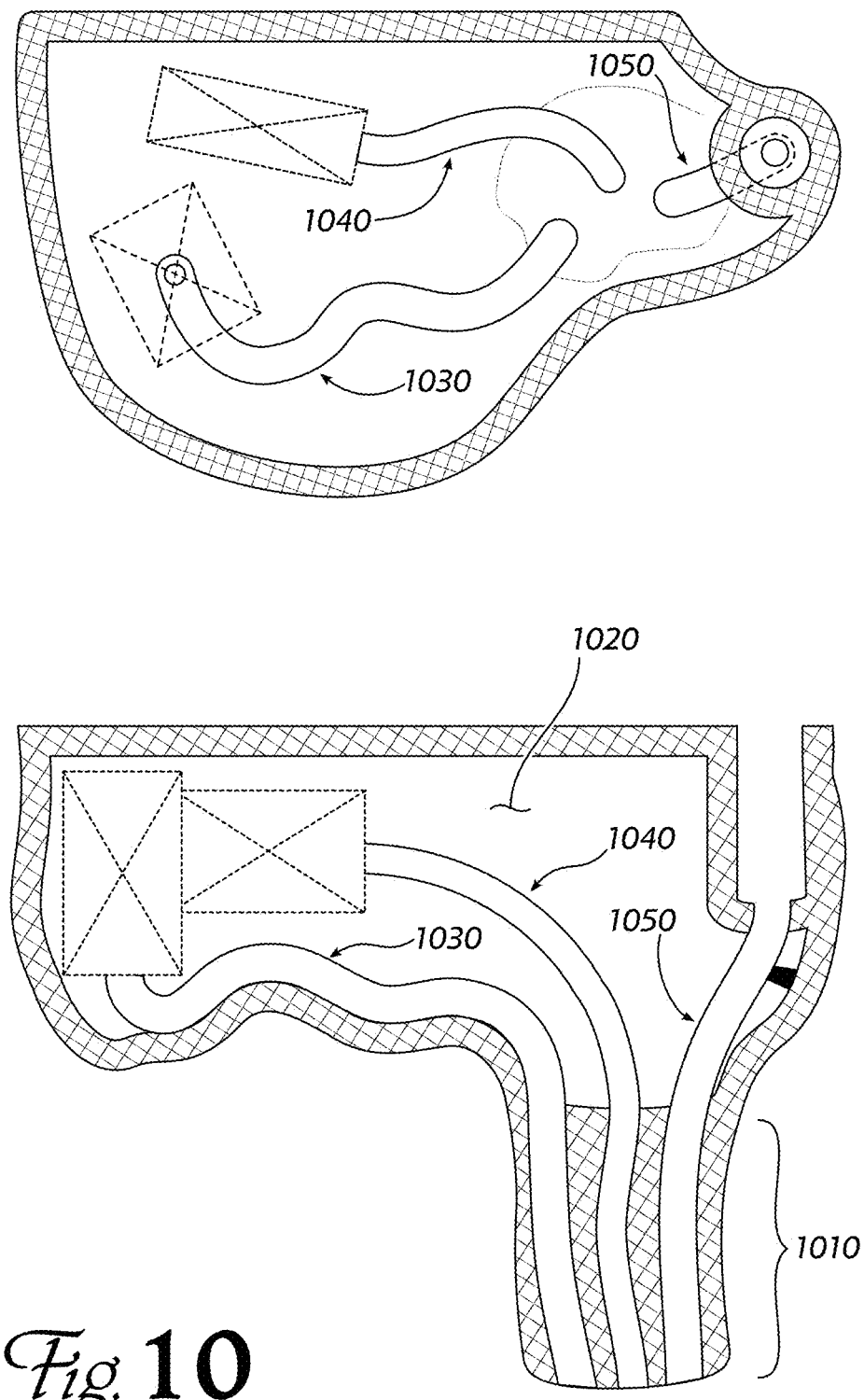
FIG. 10 illustrates simplified examples of distinguishing features of an embodiment.

Turning briefly to FIG. 10, note that the sound and vent tubes may pass through an otherwise solid portion of the housing (e.g., the protrusion that enters the user's ear canal, 1010), or they may pass through an open portion of the housing shell 1020 that rests in the user's outer ear. Tubes may adjoin or follow the inner surface of the housing shell 1030, or they may be free-standing 1040, supported only on the ends or at intervals along their length. Some tubes may be connected to the housing shell or other support structures therein by solid or perforated webs formed with the housing 1050.

Returning to FIG. 7, the virtual model is modified by "subtracting" the sound and vent tubes (740). This is a Boolean operation that changes the virtual model so that, when fabricated, housing material will be omitted from the areas where the tubes were positioned. Thus, the virtual model represents a structure through which channels have been bored.

During this virtual design process, blocks representing audio drivers and other components to be installed in the housing are positioned within the model (750). To simplify later assembly, spring clips may also be designed into the housing (760)—since the housing material is flexible and resilient, clips to hold audio drivers and other components may be formed from the same material, at the same time as the rest of the housing is manufactured.

Once all the sound tubes, vent tubes, audio-driver receptacles, securing clips and other features have been laid out in the virtual model, data representing the model is transmitted to a 3D printer which fabricates a headphone housing that is very similar to the virtual model (770). (In many workflows, the data may be stored on a computer-readable medium for future reference, and then a copy of the data may be transmitted to a printer.) Finally, the audio drivers, electronics, vent filters and other components are installed into the housing to complete the headphone (780). Preferably, at least some of the audio reproduction equipment can be installed and held in place solely by receptacles and clips formed directly in the material of the housing, without requiring adhesives, screws or other assembly aids. It is appreciated that a user's left and right ears may not be mirror images of each other, so a complete custom stereo headset may require two similar but not mirror-image housings to be designed and fabricated.

FIG. 8 shows several views of an example headphone housing constructed according to an embodiment of the invention. As can be seen, the outer shape is quite complex, with bumps, lobes and depressions corresponding to the shape of the user's ear. The protrusion that extends into the user's ear canal is circled at 810, while the adjacent portion is sized and shaped to rest in the user's outer ear. The ends of several sound and vent tubes are visible at 830, at the end of the protrusion 810. The housing may have openings such as 840 formed therein, to accept connectors or pass-throughs to connect to equipment installed inside the housing.

FIG. 9 shows additional views of the same example headphone housing. The protrusion is visible in one of these views at 910, and the hollow area where audio drivers and other components may be installed is at 920. Although the portion of the housing that rests in the user's outer ear has a very complex shape, the virtual-model designing tools can ensure that the hollow portions of the shell have a uniform wall thickness 930. The large hole at 940 in this embodiment is a receptacle for a vent filter similar to that disclosed in co-pending, commonly-owned application Ser. No. 15/425,881. A free-standing vent tube, visible at 960, connects this receptacle through the protrusion 910 to one of the holes visible in FIG. 8 at 830. The ends of three sound tubes are also visible at 950; these tubes also pass through the protrusion and exit within the user's ear canal. Finally, notch 970 is sized and shaped to accept an electrical connector when the audio reproduction equipment is installed into the housing. The sample housing depicted here does not include the audio-driver clips because they would complicate the illustration and make it difficult to understand.

In a preferred embodiment, instead of scanning, arranging and printing a fully-custom earphone housing for each user, a small number of standard-sized housings may be pre-designed, with audio equipment installation receptacles placed for efficient assembly, and sound channels routed for optimum audio performance. These standard-sized housings (e.g., small, medium and large versions, or versions with three, six, nine or twelve audio drivers) may be fabricated, pre-assembled, and used as a single monolithic component in a prior-art casting process. Note that, according to an embodiment of the invention, these standard-sized housings will nonetheless comprise complex sound and vent tubes including inflection points, bore groups, profile changes and so forth, and also clips and receptacles for installing audio equipment. This complexity arises because there is not much room in any user's ear canal and outer ear for all of the equipment needed in the earphone. Thus, even though the outer surface of a standard-sized housing does not closely complement the folds and depressions of any particular individual's ear, the housing is designed to occupy most of an ear of the particular size (small, medium or large) and to provide as much room as possible for equipment such as drivers, electronic crossovers, amplifiers, wireless receivers, batteries and so forth. (Not all headphones will contain every type of equipment.)

Figure 11:
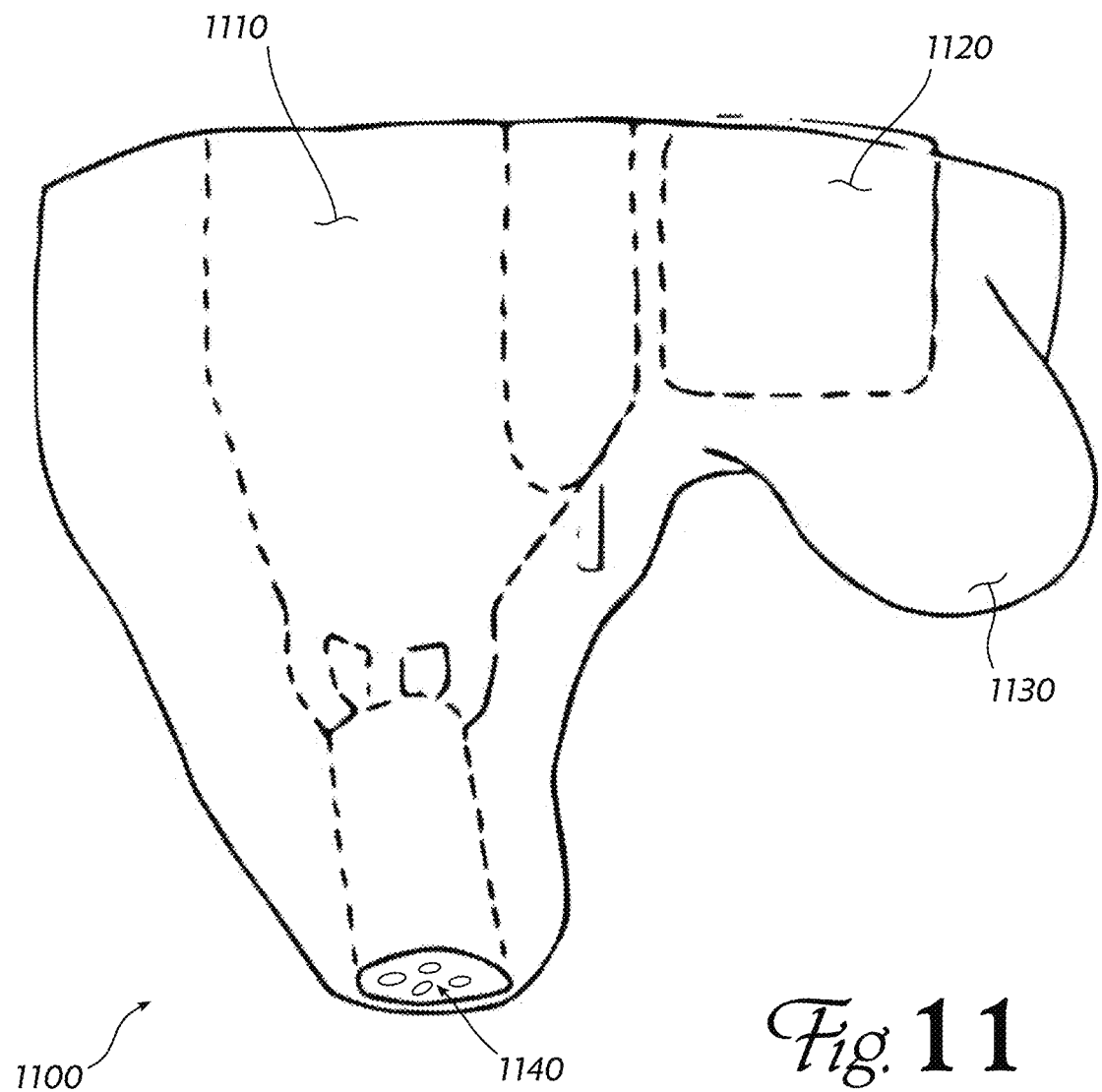
FIG. 11 shows a hybrid embodiment comprising an inventive housing combined with a prior-art casting.

With such a standard-sized housing, instead of casting a solid model of the user's ear (FIG. 5, 540) and using subtractive machining processes to open spaces to hold the audio equipment (550), the pre-fabricated, pre-assembled standard-sized component may be cast directly into the mold constructed from the custom impression of the user's ear. This approach marries the improved manufacturing characteristics and improved audio performance of an embodiment with the custom fit of a prior-art earphone. FIG. 11 shows such a hybrid embodiment at 1100: 1110 (shown in dashed outline) is a standard-sized monolithic housing component containing audio drivers and other equipment, with complex sound channels according to an embodiment to carry audio from the drivers through the protrusion to the orifices 1140 near the user's eardrum. A second standard-sized monolithic housing 1120 may be positioned adjacent the first housing 1110; this housing may contain batteries, electronics, wireless transceivers, or other components of a headphone. By splitting the standard-sized housings into multiple parts, the parts can be repositioned if necessary to fit in the space available in a particular user's outer ear.

The standard-sized housings 1110, 1120 are cast into a mold of the user's ear, so that the outer surface of the completed earphone (e.g. at 1130) closely complements the user's ear. This outer casting ensures a secure, close fit, which helps keep the earphone from falling out, and reduces the impact of extraneous noise on the audio reproduced by the earphone drivers and electronics.

The applications of the present invention have been described largely by reference to specific examples and in terms of particular arrangements of components and structures. However, those of skill in the art will recognize that earphones comprising complex, 3D-printed housings that include sound tubes, vent channels, equipment mounting receptacles and clips, and other features described above, can also be constructed by methods and techniques that vary from the foregoing description. Such variations and alternate techniques are understood to be captured according to the following claims.

We claim:

1. A method of forming a housing for an in-ear sound reproduction device, comprising:

obtaining a casting complementary to a user's outer ear canal;

constructing a virtual model of the casting;

positioning a sound tube within the virtual model, a centerline of said sound tube including at least one inflection point;

subtracting the sound tube from the virtual model to create a bored virtual model; and fabricating a housing for an in-ear sound reproduction device, said housing resembling the bored virtual model and having at least one integrated sound bore formed substantially simultaneously with the housing.

2. The method of claim 1 wherein the housing is a single-piece housing.

3. The method of claim 1 wherein the sound bore has a non-circular profile.

4. The method of claim 1 wherein the sound bore has an increasing profile area.

5. The method of claim 1 wherein the sound bore has a predetermined length.

6. The method of claim 1 wherein the sound bore comprises a socket to accept an output spout of an electroacoustic transducer.

7. The method of claim 1 wherein the sound bore comprises a discontinuous enlargement at one end, a diameter of such discontinuous enlargement equal to an outer diameter of an adapter tube, and a smaller diameter adjacent such discontinuous enlargement equal to an inner diameter of the adapter tube.

8. The method of claim 1 wherein fabricating comprises fusing together voxels of a thermoplastic substance.

9. The method of claim 1 wherein the sound tube is a first sound tube, the method further comprising:

positioning a second sound tube within the virtual model, a centerline of said second sound tube including at least one inflection point;

subtracting the second sound tube from the virtual model to create a doubly-bored virtual model, and wherein the fabricating operation produces a housing having at least two integrated sound bores corresponding to the first sound tube and the second sound tube.

10. The method of claim 1, further comprising:

positioning a representation of a sound-reproducing transducer within the virtual model so that an audio outlet of the transducer couples directly to an end of the sound tube; and adding a clip to the virtual model so that the clip is formed substantially simultaneously with the housing, said clip to hold a sealed electroacoustic transducer module in place against the at least one integrated sound bore in the housing after the housing is fabricated.

* * * * *